United States Patent
Boulos et al.

(10) Patent No.: US 6,822,899 B1
(45) Date of Patent: Nov. 23, 2004

(54) METHOD OF PROTECTING FLASH MEMORY FROM DATA CORRUPTION DURING FAST POWER DOWN EVENTS

(75) Inventors: Khaled Boulos, Sunnyvale, CA (US); Shailesh Shah, San Jose, CA (US); Carlos Awong, San Francisco, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 141 days.

(21) Appl. No.: 10/328,265

(22) Filed: Dec. 23, 2002

(51) Int. Cl.$^7$ ............................................. G11C 16/06
(52) U.S. Cl. .......................... 365/185.09; 365/185.02; 365/185.23
(58) Field of Search ...................... 365/185.09, 185.02, 365/185.29, 185.18, 185.23

(56) References Cited

U.S. PATENT DOCUMENTS 5,444,664 A * 8/1995 Kuroda et al. .............. 365/226
5,663,918 A * 9/1997 Javanifard et al. .......... 365/226
6,552,934 B2 * 4/2003 Roohparvar ........... 365/185.18

* cited by examiner

Primary Examiner—Van Thu Nguyen
Assistant Examiner—Hien Nguyen
(74) Attorney, Agent, or Firm—Bradley T. Sako; Stephen B. Ackerman

(57) ABSTRACT

In the present invention a method and circuit are shown to protect flash memory from data corruption during a rapid power down. A circuit element detect the drop in power voltage and signals that any write operation being performed be switched into a programming phase, and at the same time increase the programming voltage to the flash memory to significantly reduce programming time. If the power drop occurs during an erase phase of a write operation, the erase operation is switched to a program operation using old data to program erased cells. If the power drop occurs during a programming phase of the write operation, the programming phase is continued but at a faster rate.

20 Claims, 2 Drawing Sheets

FIG. 1 — Background Art

METHOD OF PROTECTING FLASH MEMORY FROM DATA CORRUPTION DURING FAST POWER DOWN EVENTS

BACKGROUND OF THE INVENTION

1. Field of Invention

The present invention is related to semiconductor memory and in particular flash memory and the protection from data corruption during a fast power off.

2. Description of Related Art

A write operation for a flash memory comprises an erase phase followed by a program phase. Each of these phases requires time to complete, and if power is interrupted during a write operation, the data stored in the flash memory can be corrupted. In flash memories, such as a SONOS (Silicon Oxide Nitride Oxide Silicon) flash memory, the erase and program phases each take approximately 10 ms to complete. If the power voltage drops at a rate of approximately 1V/2 ms, then the programming operation will fail to complete.

In FIG. 1 is shown a diagram of background art where an LVI (Low Voltage Inhibit circuit) 10 is used to detect when the chip voltage VDD drops below a predetermined voltage level and produce a signal 11. When a protection circuit 12 receives the low voltage signal 11 from the LVI 10 circuit, the protection circuit produces a "switch to program" signal 13 to control a MUX 16 and go into the programming phase. The MUX 16 selects between a normal write mode 14 and an LVI write mode 15, and switches to the LVI write mode upon receiving the "switch to program" signal 13. A VBG register 20 drives a DAC 21 and a combination comparator and charge pump 22 to supply a programming voltage VNEG 23 to a memory bank 24.

When the LVI circuit 10 detects a voltage drop during a write operation, the flash protection circuit 12 signals the MUX 16 to immediately go to a programming phase. If the LVI circuit 10 detects a voltage drop during the erase phase the circuitry switches to a program operation using old data currently being erased. If the voltage drop occurs during the programming phase, then the programming phase continues using new data in an attempt to complete the programming operation.

The problem with the technique describe for FIG. 1 is that a programming operation takes time to complete, for instance 10 ms. Therefore, if a fast voltage drop at a rate of approximately 1V/2 ms or faster occurs, then the programming operation will fail to complete.

SUMMARY OF THE INVENTION

It is an objective of the present invention to switch to a fast programming operation when a flash memory power voltage drop is detected during a write operation.

It is another objective of the present invention to switch to a fast programming operation when a flash memory power voltage drop is detected during the erase phase using old data to program cells that were erased.

It is still another objective of the present invention to switch to a fast programming operation when the flash memory power voltage drop is detected during the programming phase using new data to program cells that have not been programmed.

It is yet another objective of the present invention to use a program voltage adjustment circuit to control the program voltage connected to the flash memory to a maximum value, speeding up the programming operation.

The present invention detects the drop in chip voltage and controls the programming voltage connected to a flash memory to be a maximum value to reduce the programming time. An LVI (low voltage inhibit circuit) detects the drop in power supply voltage and sends a signal to control an active write operation to switch into programming mode. At the same time the LVI circuit controls a programming adjustment circuit to cause the programming voltage to the flash memory to be a maximum value. The maximum value of the programming voltage dramatically reduces the programming time to eliminate the possibility that the programming operation will not complete before power is lost.

When the erase phase of a write operation is being carried out and the flash memory power drops, the LVI circuit controls the write phase to enter a programming phase using the old data being erased to program the memory cells not programmed and at the same time controls the programming voltage to be a maximum. When the programming phase is being carried out and the flash memory power voltage drops, the LVI circuit controls the write operation to remain in the programming phase using the new data that is being programmed and controls the programming voltage to be a maximum value to reduce programming time.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
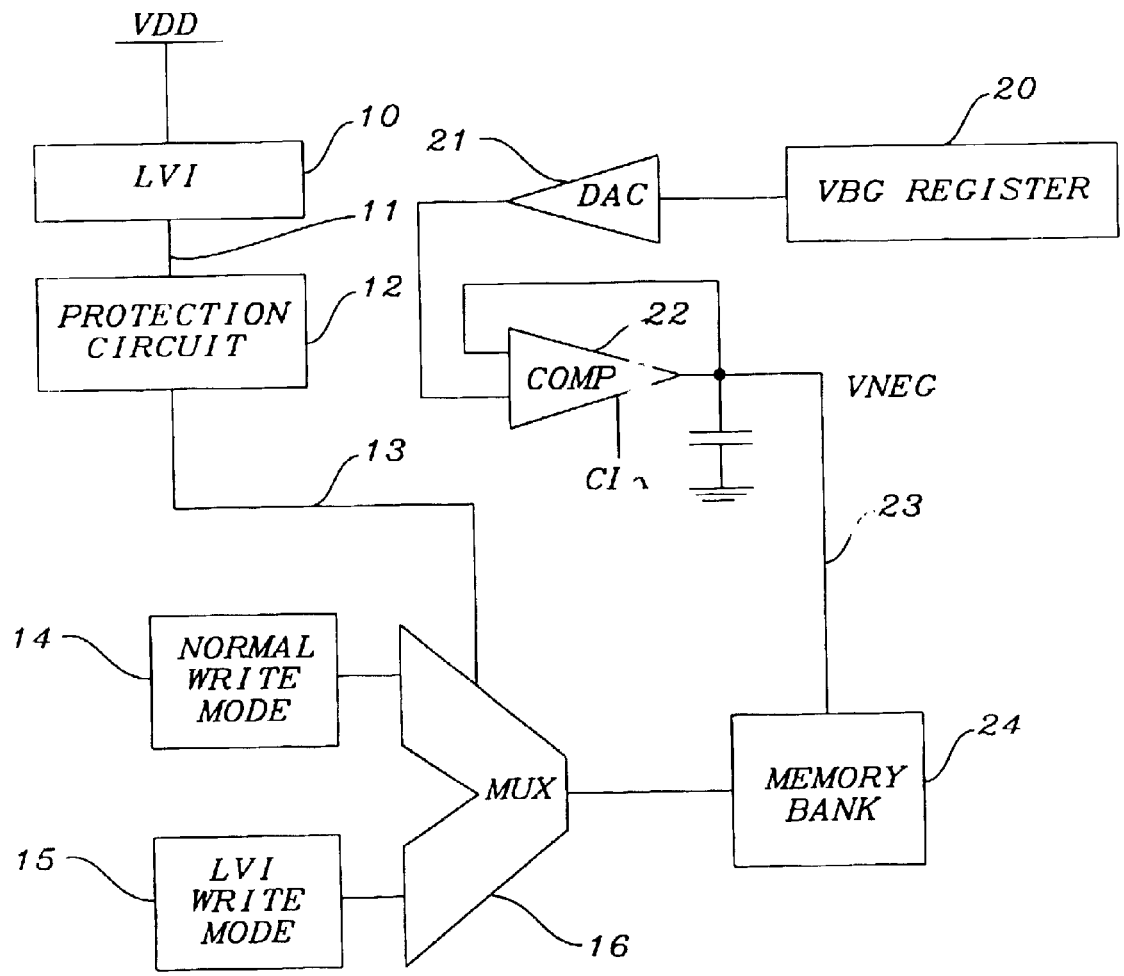
FIG. 1 is a block diagram of background art to protect a flash memory chip during a power failure occurring during a write operation.
Figure 2:
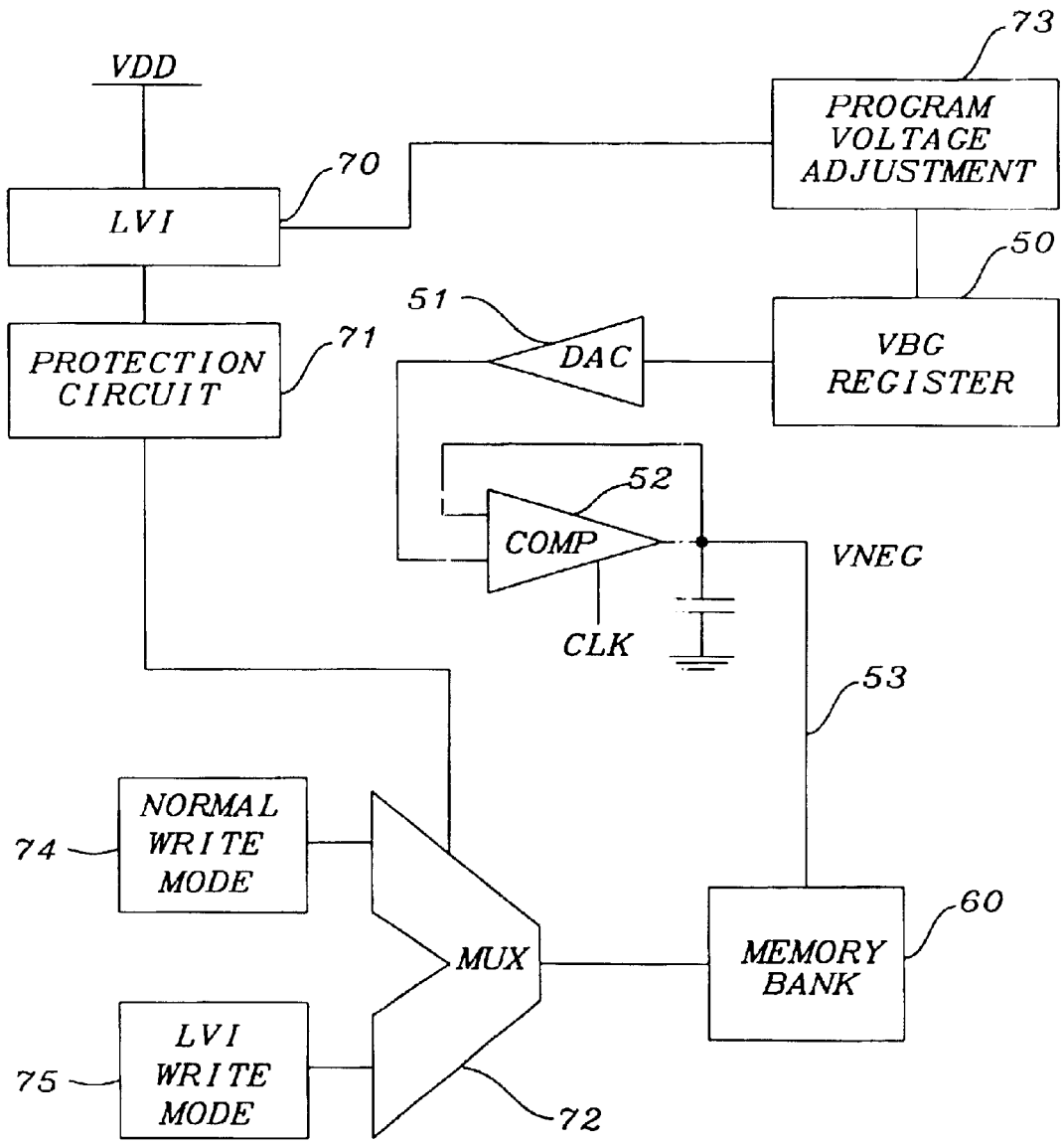
FIG. 2 is a block diagram of the present invention that dramatically reduces the time to complete a write operation during a power failure.

FIG. 2 shows a block diagram of the present invention for controlling a write operation to a known state before circuitry becomes inoperative during a drop in power voltage. A write operation is divided into two phases, an erase phase followed by a programming phase. If power to the flash memory array unexpectedly drops during either phase, data corruption will occur if the total write operation is not allowed to complete. The present invention describes a circuit and method protecting against data corruption in flash memories during fast power down events. Upon the detection of a low power voltage, the flash memory is automatically switched to the Programming phase of the write operation and the programming voltage is automatically adjusted. This automatic adjustment of the program voltage is done such as to reduce the required programming time and to allow the flash memory to be programmed to a known data state.

A VBG register 50 controls a DAC 51 which drives a compare and voltage pump circuit 52 to produce a voltage VNEG 53, which is the programming voltage for a flash memory bank 60. An LVI circuit 70 detects a voltage drop in chip voltage VDD and signals a protection circuit 71 to control a MUX 72 to switch to an LVI write mode 75 from the normal write mode 74 when a write operation is being carried out. The LVI write mode 75 is a fast program mode using old or new data depending upon whether the write operation was in an erase phase or a program phase. If the write operation is in the erase phase, the erase phase is switched to the program phase using old data to program memory cells that had been previously erased. If the write operation is in the program phase, the program phase is continued using the new data to program the erased cells. At the same time the LVI circuit 70 signals a program voltage adjustment circuit 73 to control the VBG register 50 to control a DAC 51 and a charge pump circuit 52 to produce a program voltage VNEG 53 that is at a maximum value to reduce the programming time.

When voltage drops while the memory bank 60 is in the erase phase, the write operation is switched to a programming phase to program the erased cells to the old data that was erased, and the LVI circuit 70 signals the VBG register 50 to produce a maximum program voltage VNEG 53, which markedly speeds up the programming of erased cells back to the old data. When voltage drops while the memory bank 60 is in the program phase, the write operation is maintained in the program phase using the new data to program the cells not programmed, and the LVI circuit 70 signals the VBG register 50 to produce a maximum program voltage VNEG 53, which markedly speeds up the programming of the remainder of the new data. The switching to the programming phase and the speed up of the programming rate allows the flash memory bank to be placed into a known state when a power voltage drop occurs. The maximum program voltage setting allows an eight byte wide flash memory bank to be programmed in approximately 1 ms as opposed to 10 ms with the normal programming voltage.

While the invention has been particularly shown and described with reference to preferred embodiments thereof, it will be understood by those skilled in the art that various changes in form and details may be made without departing from the spirit and scope of the invention.

What is claimed is:

1. A method to protect a flash memory against data corruption during a fast power down of the memory, comprising:
    a) writing to a flash memory,
    a) detecting a power voltage drop to said flash memory during a write operation,
    b) controlling said write operation to be in a program phase,
    c) controlling a programming voltage to said flash memory to a high voltage,
    d) programming said flash memory to a known state before circuitry becomes inoperative.

2. The method of claim 1, wherein controlling said write operation to be in said program phase, further comprises:
    a) switching from an erase phase to said program phase when said power voltage drop is detected during said erase phase and programming erased cells with old data previously erased,
    b) continuing to program erased memory cells with new data when said power voltage drop is detected during said program phase.

3. The method of claim 1, wherein controlling said program voltage to said flash memory sets a predetermined value into a register controlling a DAC that drives a voltage pump to create said high voltage connected to the flash memory.

4. The method of claim 1, wherein controlling said programming voltage to said flash memory to said high voltage reduces a programming time of said flash memory cells.

5. The method of claim 1, wherein detecting a power voltage drop is done by a low voltage inhibit circuit which communicates the power voltage drop to a protection circuit to put said flash memory into said program phase of said write operation and to a program voltage adjustment circuit to increase said programming voltage.

6. The method of claim 1, wherein programming said flash memory to a known state before circuitry becomes inoperative as a result of said power voltage drop requires controlling said program voltage to a maximum value to reduce a programming time for cells of said flash memory.

7. A flash memory chip means for protecting against data corruption during a write operation, comprising:
    a) a means for detecting a power voltage drop to a flash memory,
    b) a means for automatically switching from an erase phase to a program phase during a write operation,
    c) a means for automatically decreasing program time of cells of said flash memory.

8. The flash memory chip means of claim 7, wherein said means for detecting said power voltage drop while in the erase phase of said write operation allows a switch from said erase phase to said program phase using old data to program erased cells.

9. The flash memory chip means of claim 7, wherein said means for detecting said power voltage drop while in the program phase of said write operation continues said program phase using new data to program erased cells.

10. The flash memory chip means of claim 7, wherein said means for switching from said erase phase to said program phase during said write operation allows programming of erased cells with old data that was erased before said power voltage drop occurred.

11. The flash memory chip means of claim 7, wherein said means for decreasing programming time is done by increasing a programming voltage to said flash memory upon detection of said power voltage drop.

12. The flash memory chip means of claim 7, wherein said means for decreasing program time of cells of said flash memory chip allows programming of said cells to a known state before the flash memory becomes inoperative.

13. A circuit to protect against data corruption in flash memory during fast power down, comprising:
    a) a flash memory,
    b) a low voltage inhibit circuit monitoring power voltage to said flash memory,
    c) a protection circuit controlling a selection of a write mode,
    d) a program voltage adjustment circuit,
    e) said low voltage inhibit circuit controlling said protection circuit and said program voltage adjustment circuit to switch said write mode of said flash memory to a fast programming operation upon detecting a drop in power voltage to said flash memory.

14. The circuit of claim 13, wherein said protection circuit controls a MUX to select said fast programming operation when said low voltage inhibit circuit detects a drop in flash memory power voltage.

15. The circuit of claim 13, wherein said program voltage adjustment circuit adjusts a programming voltage to said flash memory to a high voltage when said drop in power voltage is detected by said low voltage inhibit circuit.

16. The circuit of claim 15, further comprising:
    a) a register controlled by said program voltage adjustment circuit,
    b) a DAC controlled by said register controlling a charge pump,
    c) an output voltage of said charge pump used as said programming voltage for said flash memory.

17. The circuit of claim 15, wherein said high voltage speeds up programming of cells of the flash memory to complete the fast programming operation before said flash memory becomes inoperative.

18. The circuit of claim 13, wherein said protection circuit selects said fast programming operation when said drop in power voltage is detected by said low voltage inhibit circuit.

19. The circuit of claim 13, wherein the write mode is switched from an erase operation to the fast programming operation when said drop in power voltage occurs during said erase operation and erased cells are programmed with old data that was previously erased.

20. The circuit of claim 13, wherein a normal programming operation is switched to said fast programming operation when said drop in power voltage is detected during said normal programming operation and erased cells are programmed with new data.

* * * * *